United States Patent [19]

Miller et al.

[11] B  3,990,062

[45] Nov. 2, 1976

[54] RESOLVER TO DIGITAL CONVERTER

[75] Inventors: George W. Miller, Anoka; Larry A. Meyer, Minneapolis, both of Minn.

[73] Assignee: FMC Corporation, San Jose, Calif.

[22] Filed: Feb. 3, 1975

[21] Appl. No.: 546,665

[44] Published under the second Trial Voluntary Protest Program on January 20, 1976 as document No. B 546,665.

[52] U.S. Cl................................ 340/198; 323/106; 340/206
[51] Int. Cl.²........................................ G08C 19/48
[58] Field of Search............. 340/198, 196, 347 SY; 323/106, 51, 52, 108, 120; 318/85, 605, 661

[56] References Cited

UNITED STATES PATENTS

| | | | |
|---|---|---|---|
| 2,980,900 | 4/1961 | Rabin................................. | 340/198 |
| 3,258,667 | 6/1966 | McDonough et al.............. | 340/206 |
| 3,562,740 | 2/1971 | Watkins............................. | 318/661 |
| 3,634,838 | 1/1972 | Granquist......................... | 340/198 |
| 3,803,567 | 4/1974 | Pezzlo et al...................... | 340/198 |

*Primary Examiner*—John W. Caldwell
*Assistant Examiner*—James J. Groody
*Attorney, Agent, or Firm*—R. S. Kelly; L. B. Guernsey; C. E. Tripp

[57] ABSTRACT

A resolver to digital converter which provides digitally generated sinusoidal voltages to apply to the stator windings of the resolver. The oscillator providing the digital pulses is connected to a counter which is reset on a particular phase of one of the stator winding voltages. The output of the counter is transferred into an output register at a particular phase of the rotor voltage with the output register thereby providing a digital reading of the angular position of the rotor. Digital comparator means are provided for insuring that the stator voltages remain exactly 90° out of phase, and further means are provided for insuring that the stator voltages remain at the same amplitude.

7 Claims, 4 Drawing Figures

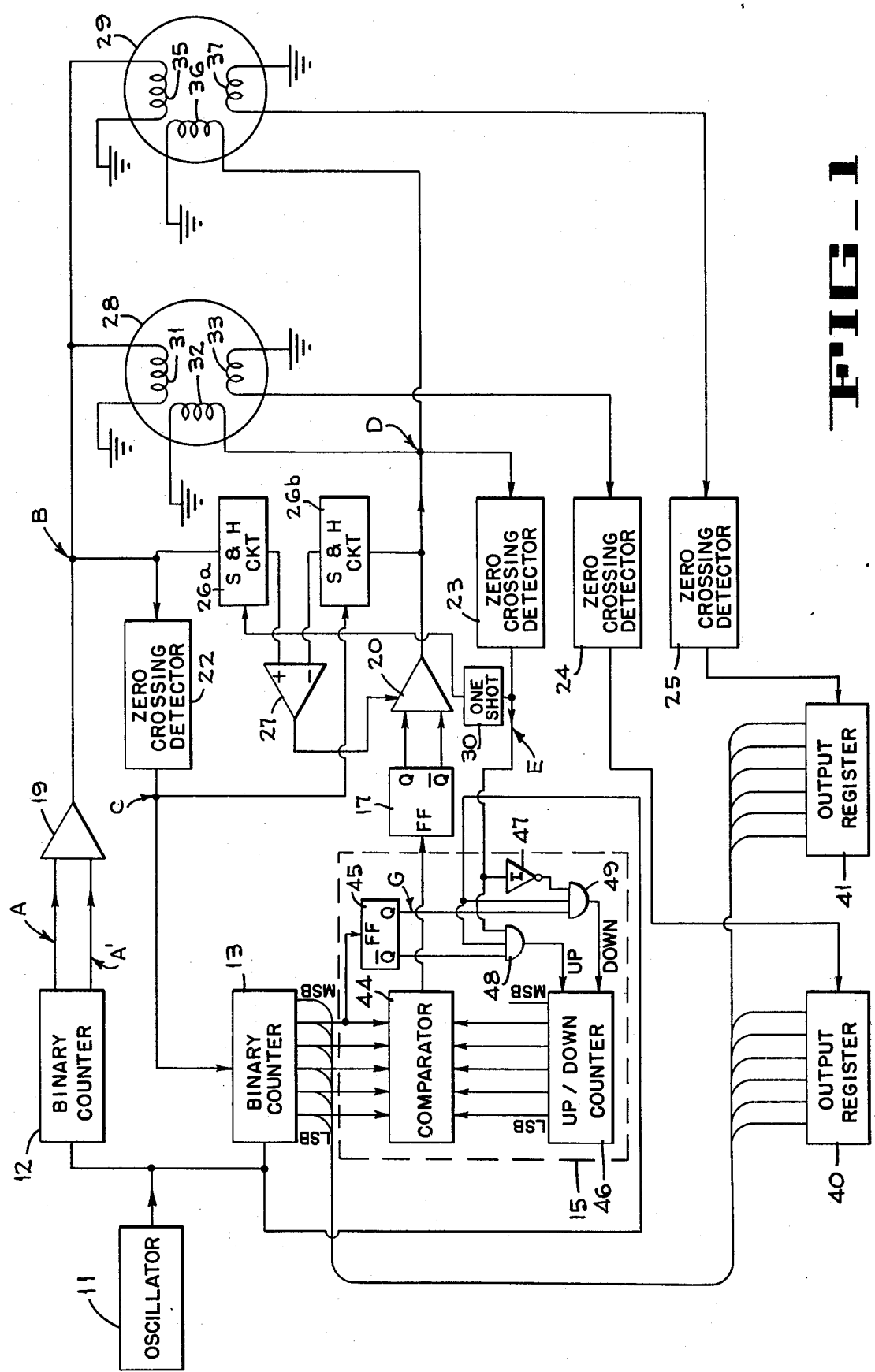

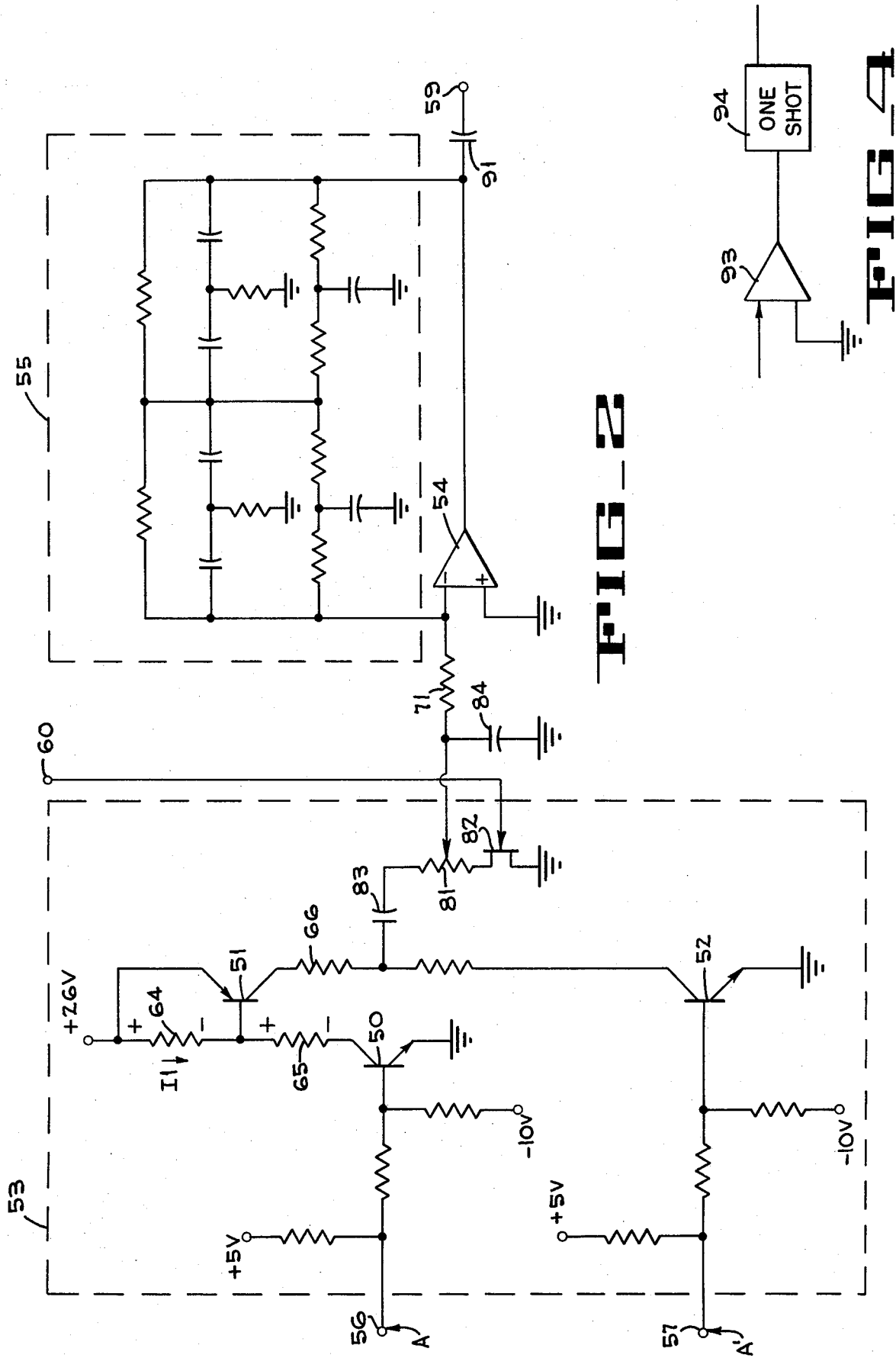

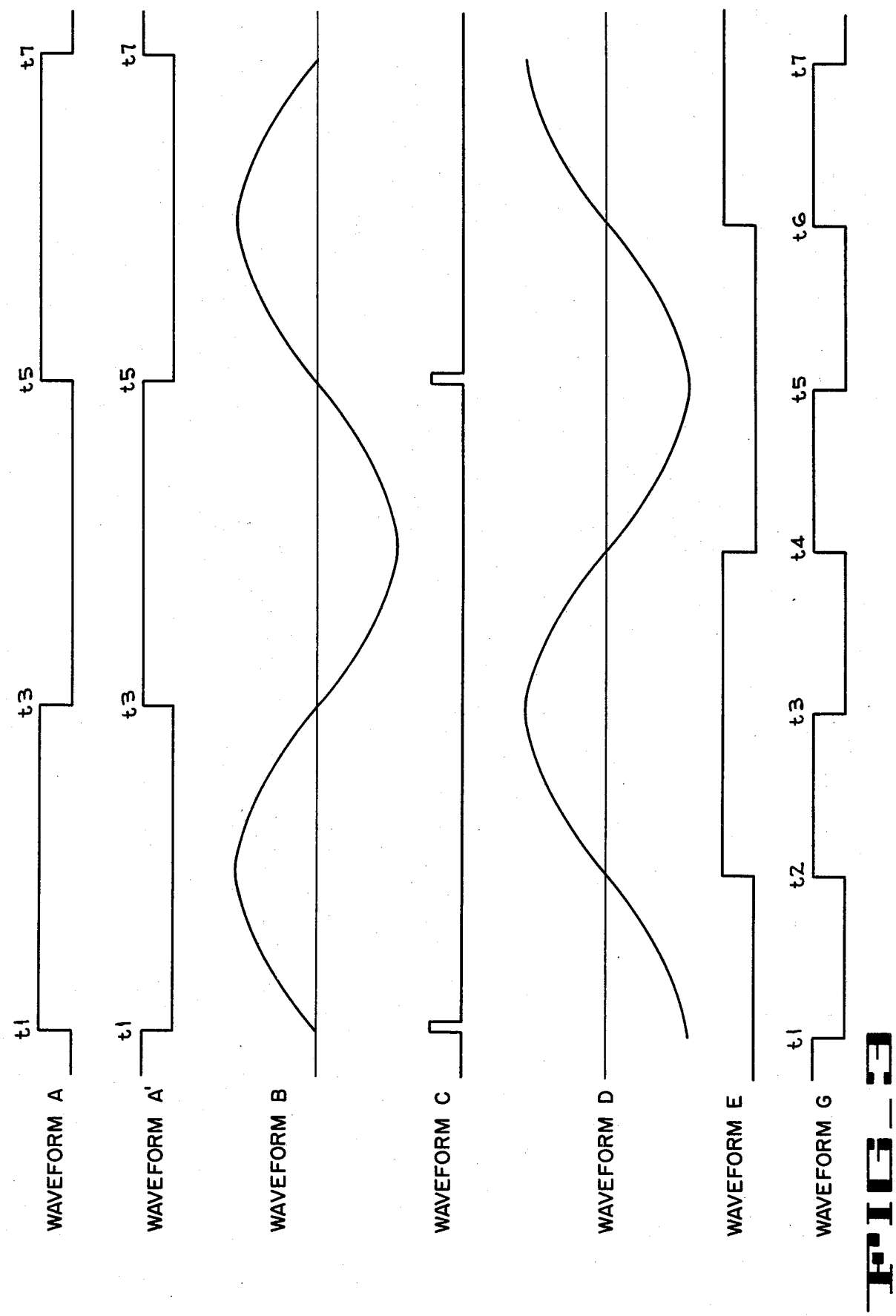

RESOLVER TO DIGITAL CONVERTER

BACKGROUND OF THE INVENTION

1. Field of the Invention

This invention pertains to a resolver to digital converter and more particularly to a resolver to digital converter which uses digital signals to provide accurate control of the excitation voltages applied to the resolver windings so that the accuracy of the digital output representation is improved.

2. Description of the Prior Art

In many types of equipment it is desirable to reliably and accurately measure the position of a rotatable shaft and to convert the resulting measurement into a digital signal which is representative of the shaft position. One such type of equipment where it is desirable to digitally measure angular position is a weapons delivery system where the elevation and azimuth pointing angles must be accurately measured. Some of the prior art converters make use of the conventional resolver or synchro transmitter having a rotor winding and a plurality of stationary windings. A voltage source and a phase shifter supply multiphase AC voltages to the stator windings to induce a magnetic flux which rotates at the frequency of the applied voltage and induces an AC voltage in the rotor winding. The AC voltage in the rotor winding has a phase angle which varies with the angular position of the rotor. Thus, the angular position of the rotor can be determined by measuring the difference in phase angle between the voltage induced in the rotor winding and a fixed reference voltage. Such difference can be measured by determining the time which elapsed between the zero passage of the reference voltage and the zero passage of voltage from the rotor winding, and this time can be expressed as a digital representation of the rotor angle. A serious disadvantage of the foregoing type of equipment is that a very high degree of accuracy must be maintained between the phase of the voltages applied to the various stator windings. Aging of the components used in the circuitry may cause a change in phase between the voltages applied to the various stator windings and therefore cause inaccuracies in the measured angle between the reference voltage and the voltage produced by the rotor winding. These inaccuracies lead to an inaccurate output reading of the angular position of the rotor.

One type of prior art apparatus as shown in prior U.S. Pat. No. 3,634,838, uses a high-frequency signal source to develop signals for the stator windings of a resolver or goniometer having three stator windings and a rotor winding. The signal source develops high-frequency pulses which are reduced to low-frequency pulses by a frequency divider. The output of the frequency divider is coupled to a filter which converts the pulses into a sinusoidal voltage that is coupled to one of the stator windings. The sinusoidal voltage from the filter is applied to a first stator winding and to a 90° phase shifter. The phase shifter develops a second sinusoidal voltage shifted 90° from the first voltage, the second sinusoidal voltage being applied to a second stator winding. A counter which is coupled to the signal source is used to count the high-frequency periods. In addition, a phase detector is provided for comparing the phase of an output voltage from the counter with that of a reference voltage from the goniometer. The phase of the pulses from the frequency divider is controlled relative to the phase of the voltage from the counter by varying the number of pulses supplied to the frequency divider. This prior art apparatus has no provision for correcting any variation in the phase angle between the voltages applied to the first and second stator windings of the goniometer.

SUMMARY OF THE INVENTION

In accordance with the present invention a high-frequency oscillator develops pulses which are coupled to a circuit which converts the pulses into a first low-frequency sinusoidal voltage and applies this voltage to a first stator winding of a resolver. A comparison circuit and a second filter develop a second sinusoidal voltage 90° out of phase with the first sinusoidal voltage. This second voltage is applied to the second stator winding of the resolver. The comparison circuit senses the phase angle between the voltages applied to the first and second stator windings and corrects any deviation from the 90° phase difference. A counter coupled to the oscillator and initiated by a signal from one of the stator windings develops a count signal which is triggered into an output register by a signal from the rotary winding of the resolver. This count signal digitally represents the angular position of the rotor.

The advantages of this invention will become apparent from the following description when taken in connection with the accompanying drawings.

BRIEF DESCRIPTION OF THE DRAWINGS

FIG. 1 is a schematic drawing of an embodiment of the present invention.

FIG. 2 is a schematic drawing of a square-wave amplifier and filter which can be used in the embodiment shown in FIG. 1.

FIG. 3 illustrates a plurality of waveforms taken at different points in the circuitry of FIG. 1 which are useful in explaining the operation of the present invention.

FIG. 4 illustrates a zero crossing detector which can be used in the embodiment of the invention shown in FIG. 1.

DESCRIPTION OF THE PREFERRED EMBODIMENT

Referring more particularly to the drawings by characters of reference, FIG. 1 discloses circuitry for digitally representing the angular positions of a pair of rotors for resolvers 28 and 29, which circuitry includes an oscillator 11. This oscillator develops high-frequency pulses which are used to provide synchronized low-frequency voltages for the resolver stator windings and are used to provide synchronized digital read out of the angular position of the rotors for the resolvers 28 and 29. High-frequency pulses from oscillator 11 are converted to low-frequency square-wave signals (waveforms A and A' in FIG. 2) by a binary counter 12 and applied to the input leads of an amplifier/filter 19. Amplifier/filter 19 converts the low-frequency square-wave into a low-frequency sinusoidal voltage (waveform B in FIG. 3) which is applied to stator winding 31 of the resolver 28, a corresponding stator winding 35 of the resolver 29, and to the input lead of a zero crossing detector 22. Signals from the oscillator 11, from the zero crossing detector 22 and from a zero crossing detector 23 cause a comparison means 15 to develop a cosine voltage or sinusoidal voltage (waveform D in FIG. 3) 90° out of phase with the voltage applied to the first stator windings 31 and 35. This cosine voltage is applied to a second stator winding 32 of resolver 28 and a second stator winding 36 of resolver 29. The low-frequency voltages applied in quadrature phase to the fixed windings 31 and 32 of the resolver 28 and to the fixed windings 35 and 36 of the resolver 29 create a rotating magnetic field in each of the resolvers. Due to the rotating fields in the resolvers the phase of the output voltage from the rotor winding 33 of the resolver 28 and from the rotor winding 37 of the resolver 29 corresponds to the angular positions of the resolver rotors.

Oscillator 11 applies high-frequency pulses to a binary counter 13 causing counter 13 to count in a continuous manner. At the end of each complete cycle of sinusoidal voltage applied to the stator winding 31 of resolver 28, the zero crossing detector 22 detects the positive moving zero crossing of the stator voltage and provides a short duration pulse (waveform C in FIG. 3) which resets the binary counter 13 to a count of zero. The output of counter 13 is coupled to the bit inputs of an output register 40 so that information from the binary counter can be parallel transferred into the register. The voltage from the rotor winding 33 of the resolver 28 is applied to the input lead of a zero crossing detector 24 which provides an output pulse at the end of each cycle of the sinusoidal voltage from winding 33 (at a positively moving zero crossing of the voltage). This pulse from the output lead of the zero crossing detector 24 is connected to the trigger input of the output register 40 and causes the count from the binary counter 13 at the time of triggering to be loaded into the output register. The count which is loaded into the output register 40 then is a measure of the elapsed time or phase angle between the stator and rotor voltages and represents the rotary position of rotor 33 at the time the output register is loaded.

The comparison means 15 insures that the sinusoidal voltage applied to the second stator winding 32 is substantially 90° out of phase with the sinusoidal voltage applied to the stator winding 31. The operation of the comparison means 15 of FIG. 1 will now be discussed in connection with the waveforms shown in FIG. 3. As described above, oscillator 11 provides high-frequency pulses which are converted by binary counter 12 to a low-frequency square wave and converted by amplifier/filter 19 to the sinusoidal waveform B shown in FIG. 3. At the end of each cycle of waveform B the zero crossing detector 22 provides the short duration pulses as shown in waveform C of FIG. 3. These pulses from zero crossing detector 22 are directed to the reset input of binary counter 13 to cause the binary counter to be reset to a count of zero. The width of the pulses from the zero crossing detector is determined by the values of the components used in the detector.

The cosine voltage developed in stator winding 32 causes the zero crossing detector 23 to provide the square wave pulses of waveform E at the end of each cycle of the cosine voltage waveform D. The phase of the waveform E from the zero crossing detector 23 is compared with signals from the binary counter 13. When these signals are properly phased 90° apart, the sinusoidal voltage at stator winding 31 is 90° out of phase with the cosine voltage applied to stator winding 32. Signals from the second-most significant bit of counter 13 are applied to a flip-flop 45 with the complementary signal outputs therefrom being compared with the voltage shown in waveform E. The output from the Q output lead of flip-flop 45 is shown as waveform G of FIG. 3. Pulses from the oscillator 11 are used to gate the signals of waveforms G and E through a pair of AND gates 48 and 49 so that the phase of these two waveforms can be compared. A control signal is developed which will cause the voltage of waveform E to be shifted so that the phases of waveforms G and E are as shown in FIG. 3. The pulses from the zero crossing detector 23 are applied to a first lead of the AND gate 48 and through an inverter 47 to a first lead of AND gate 49. When one of the AND gates is enabled a voltage coupled from oscillator 11 will cause one of the gates 48 and 49 to produce a pulse or series of pulses which causes the up/down counter 46 to either count upward or downward. When the waveforms E and G have the same phase AND gates 48 and 49 are always disabled. For example, at time $t2$ (FIG. 3) the positive voltage of waveform E is inverted by inverter 47 so that gate 49 is disabled. At this time the voltage from the Q output lead of flip-flop 45 is low so that gate 48 is disabled. The count in up/down counter 46 will then be equal to the count in counter 13 at time $t2$ so that comparator 44 provides pulses to flip-flop 17. Flip-flop 17 provides signals to amplifier/filter 20 which develops the cosine voltage of waveform D.

When the voltage of detector waveform E is out of phase so that the positive pulse occurs after time $t2$ the count in up/down counter 46 is decreased to again provide the proper phase between waveforms G and E. This will occur because at time $t2$ the low value of voltage of waveform E will be inverted by inverter 47 so that a positive voltage from waveform E and a positive voltage from waveform G cause gate 49 to provide an output pulse (or pulses) when an oscillator pulse (or train of pulses) is applied to the gate. The output pulses from gate 49 cause the up/down counter to count down so that the next compare signal from comparator 49 will occur sooner and therefore have the effect of shifting waveform D toward waveform B (i.e., toward the desired 90° phase angle).

When the voltage of detector waveform E is out of phase so that the positive pulse occurs before time $t2$, a positive voltage from the Q output of flip-flop 45 and the positive value of signal from waveform E enable AND gate 48 during the time an oscillator pulse or pulses are received by the gate. Gate 48 provides output pulses which causes up/down counter 46 to count up so that counts in counters 46 and 13 will compare later which has the effect of shifting waveform D away from waveform B (i.e., toward the desired 90° phase angle). When the voltages on the output leads of binary counter 13 and counter 46 are the same the comparator 44 will supply an output pulse. Since all of the leads of the counters 13 and 46 except the "most significant bit" leads are connected to the comparator the voltage on the leads from counter 13 and the voltage on the leads from up/down counter 46 are the same twice each cycle of the sinusoidal waveform B. This causes comparator 44 to provide two pulses for each cycle of the sinusoidal waveform. A flip-flop 17 is used to divide by two the pulse frequency to the input leads of amplifier/filter 20 so that the frequency of the voltage from amplifier/filter 20 is the same as the frequency of the sinusoidal voltage from amplifier/filter 19, but is 90° out of phase as shown in waveform D.

While only the application of the voltage waveforms to stator windings 31 and 32 of resolver 28 have been described in detail it will be understood that the application of voltages to stator windings 35 and 36 or resolver 29 (which are connected in parallel with windings 31 and 32 respectively) will be the same. Furthermore, while only two resolvers 28 and 29 are shown it should be understood that any number of resolvers could be connected in the circuit of FIG. 1. Each of the first stator windings would be connected to the output lead of amplifier/filter 19 while each of the second stator windings would be connected to the output lead of amplifier/filter 20. An additional output register and an additional zero crossing detector would be included for each of the resolvers added to the circuit of FIG. 1. The input leads of each of the output registers would be connected to the output leads of the binary counter 13 and the input leads of each of the zero crossing detectors would be connected to the corresponding rotor winding of one of the additional resolvers. As shown in FIG. 1, the rotor winding 37 of resolver 29 is connected to the zero crossing detector 25 (similar to detector 24) which serves to trigger the count in counter 13 into an output register 41 to read the rotor position of resolver 29.

Details of the amplifier/filters 19 and 20 of FIG. 1 are shown in FIG. 2. Each of the amplifiers/filters includes a square wave amplifier 53, an operational amplifier 54 and a double twin T filter 55. Amplifier 53 increases the amplitude of the square wave developed by binary counter 12 of FIG. 1 while amplifier 54 and the double twin T filter 55 convert the square wave into a sinusoidal voltage. The voltage waveform A of FIG. 3 is applied to the signal input terminal 56 of the square wave amplifier 53 and the waveform A' of FIG. 3 is applied to the signal input terminal 57. Between times $t1$ and $t3$ of waveform A the positive voltage on terminal 56 causes transistor 50 to be rendered conductive so that a current I1 flows from the +26 volt source through resistors 64 and 65 and through transistor 50 to ground. Current I1 provides a voltage drop of the polarity shown across resistor 64 so that the voltage at the base of transistor 51 is less positive than the voltage on the emitter of transistor 51. The difference between the base voltage and the emitter voltage causes transistor 51 to be rendered conductive so that the +26 volts from the source is coupled from the emitter to the collector of transistor 51. At the same time a low value of voltage on the input terminal 57 renders transistor 52 non-conductive. Thus the +26 volts is coupled through transistor 51 and resistor 66 to the left side of capacitor 83 thereby causing a current to flow to ground through a potentiometer 81 and a field effect transistor 82 thereby providing a positive voltage on the arm of the potentiometer.

Between times $t3$ and $t5$ a positive value of voltage on input terminal 57 renders transistor 52 conductive so that a low value of voltage from the collector of transistor 52 applied to capacitor 83 cause the voltage on the arm of potentiometer 81 to go negative. At this same time a low value of voltage on input terminal 56 renders transistors 50 and 51 nonconductive. Thus a large amplitude cyclic signal is provided at the arm of potentiometer 81 and this signal is passed through an integrator comprised of capacitor 84 and resistor 71 and applied to the inverting input lead of an operational amplifier 54. The signal is further processed and shaped by amplifier 54 which includes a double twin-T filter 55 in its feedback loop tuned to the frequency of the input waveform. The double twin-T filter 55 allows a very narrow range of frequencies to be passed so that only the fundamental frequency contained in waveform A will appear at the output terminal after passing through decoupling capacitor 91. Thus, the square wave as shown in waveform A is converted to the sinusoidal voltage shown in waveform B.

Details of the zero crossing detectors 22, 24 and 25 of FIG. 1 are shown in FIG. 4. The sinusoidal voltage from the resolver windings (e.g., waveform B of FIG. 3) is applied to the upper input lead of an operational amplifier 93 to cause the amplifier to switch suddenly from a saturated condition to a cutoff condition as the input voltage changes polarity. This causes the amplifier 93 to develop a square wave output voltage centered on the zero crossing points of the input sinusoidal voltage as shown, for example, in waveform A'. Each decrease in the voltage on the output lead of amplifier 93 triggers a one-shot 94 causing the one-shot to provide a positive short duration output pulse as shown in waveform C (which represents the output wave-form for the zero crossing detector 22). The zero crossing detector 23, which provides the disabling pulses for the logic gates 48 and 49, is similar but does not include the one-shot circuit 94 so that its output is carried through each half cycle (as shown in waveform A').

The sinusoidal voltages B and D applied to the stator windings of the resolvers are also continuously monitored and corrected to insure that their amplitudes will be the same in order not to introduce errors into the converter circuitry. In order to provide for this function, a pair of sample and hold circuits, 26a and 26b, a differential amplifier 27 and a one-shot 30 are provided to vary the gain of the filter/amplifier 20 to cause the amplitude of the cosine voltage applied to stator winding 32 to be the same as the amplitude of the sinusoidal voltage applied to stator winding 31. The pulse from zero crossing detector 22 causes the sample and hold circuit 26b to develop a voltage equal to the peak value of voltage shown in waveform D. A similar signal from zero crossing detector 23 and one-shot circuit 30 causes the sample and hold circuit 26a to develop a voltage equal to the peak value of voltage shown in waveform B. The voltages from circuits 26a and 26b are applied to the input leads of a differential amplifier 27. When these two input voltages are different the amplifier develops a voltage which is applied to input terminal 60 of the amplifier 53 of the amplifier/filter 20 shown in FIG. 2. The voltage from terminal 60 is applied to the cathode of a field effect transistor or FET 82, as shown in FIG. 2. The voltage on the cathode of FET 82 determines the resistance across FET 82 and determines the value of the voltage applied to the upper input lead of amplifier 54. The voltage on the upper input lead of amplifier 54 controls the gain of amplifier 54 so that the signal on output terminal 59 has the same amplitude as the sinusoidal voltage from filter/amplifier 19. Thus, the amplitude of the cosine voltage (waveform D) will follow that of the sinusoidal voltage of waveform B.

Although the best mode contemplated for carrying out the present invention has been herein shown and described, it will be apparent that modification and variation may be made without departing from what is regarded to be the subject matter of the invention.

What is claimed is:
1. A resolver to digital converter comprising a resolver having first and second stator windings and a rotor winding; an oscillator which develops high-fre- quency pulses; means for converting said high-frequency pulses into a first low-frequency sinusoidal voltage, said means for converting being connected between said oscillator and said first stator winding of said resolver; means for generating a second low-frequency sinusoidal voltage 90° out of phase with said first sinusoidal voltage, said means for generating being connected to said second stator winding of said resolver; first, second and third means for sensing the phase of a sinusoidal voltage and for producing pulses at a predetermined phase of said sinusoidal voltage, said first means for sensing being coupled to said first stator winding, said second means for sensing being coupled to said second stator winding, said third means for sensing being connected to said rotor winding; comparison means for comparing the phase of said pulses from said first and said second means for sensing, said comparison means providing a signal which drives said means for generating said second sinusoidal voltage 90° out of phase with said first sinusoidal voltage, said comparison means being coupled to said first and second means for sensing and to said means for generating said second sinusoidal voltage; counting means for developing counting signals in response to input pulses, said counting means being connected to said oscillator, said counting means being coupled to said first and means for sensing to reset said counting means at a predetermined phase of said first sinusoidal voltage; and an output register, said register being connected between said counting means and said third means for sensing whereby a pulse from said third means for sensing causes said counting signals from said counting means to be loaded into said register.

2. A resolver to digital converter as defined in claim 1 wherein said comparison means includes a counter and a comparator, said counting means being connected between said comparator and said first means for sensing phase, said counter being connected between said comparator and said second means for sensing phase, said comparator developing signal pulses when the count in said counting means equals the count in said counter, said comparator being coupled to said means for generating said second sinusoidal voltage whereby said signal pulses from said comparator are used to develop said second sinusoidal voltage.

3. A resolver to digital converter as defined in claim 1 including at least one additional resolver having first and second stator windings and a rotor winding, said first and said second stator windings being coupled to said first and said second stator windings respectively of said first mentioned resolver; at least one additional means for sensing the phase of a sinusoidal voltage; and at least one additional output register, said additional means for sensing being coupled to said rotor winding of said additional resolver and to said additional register, said additional register being connected to receive the output of said counting means.

4. A resolver to digital converter comprising a resolver having first and second stator windings and a rotor winding; an oscillator which develops high-frequency pulses; means for converting said high-frequency pulses into a first low-frequency sinusoidal voltage, said means for converting being connected between said oscillator and said first stator winding of said resolver; counting means for producing counting signals in response to input pulses, said counting means being connected to said oscillator; means for synchronizing the counting signals from said counting means with said first sinusoidal voltage, said means for synchronizing being connected between said counting means and said means for converting; means for developing a second low-frequency voltage 90° out of phase with said first sinusoidal voltage from said counting signals, said means for developing said second sinusoidal voltage being connected between said counting means and said second stator winding of said resolver, said counting signals causing said second sinusoidal voltage to be generated 90° out of phase with said first sinusoidal voltage; an output register, said register being connected to said counting means; and triggering means, said triggering means being connected between said register and said rotor winding of said resolver, said triggering means producing a trigger pulse at a predetermined phase of the voltage developed in said rotor winding, said trigger pulse causing said counting signals from said counting means to be loaded into said register.

5. A resolver to digital converter as defined in claim 4 wherein said means for developing said second sinusoidal voltage includes a counter for producing binary signals in response to input signals; phase sensing means for producing phase pulses in response to a predetermined phase of a sinusoidal signal, said phase sensing means being connected between said second stator winding of said resolver and said counter; comparator means connected between said counter and said counting means, said comparator means producing an output signal each time said binary signals from said counter match said counting signals from said counting means; and means for generating said second low-frequency sinusoidal voltage 90° out of phase with said first sinusoidal voltage, said second voltage being developed from said output signal from said comparator means, said means for generating said second voltage being connected between said comparator means and said second stator winding of said resolver.

6. A resolver to digital converter as defined in claim 4 including means for sensing the amplitudes of said first and said second sinusoidal voltages, and means associated with said voltage amplitude sensing means for comparing the amplitudes of said first and said second sinusoidal voltages, said means for comparing including means for controlling the amplitude of the voltage from said means for developing said second sinusoidal voltage so that the amplitude of said second sinusoidal voltage is substantially equal to the amplitude of said first sinusoidal voltage.

7. A resolver to digital converter comprising a high frequency signal source; a frequency divider connected to said source, said divider providing a low-frequency signal; first and second filtering means for converting a low-frequency signal to a sinusoidal signal, each of said filtering means having an input and an output, said input of said first filtering means being connected to the output of said divider; a resolver having first and second stator windings and a rotor winding; said first stator winding being connected to said output of said first filtering means; first, second and third zero crossing detectors each having an input and an output, said input of said first detector being connected to said output of said first filtering means; a binary counter having a signal input, a reset input and a plurality of output leads, said signal input lead of said binary counter being connected to said high frequency signal source, said reset input lead being connected to said output of said first detector, said first detector providing a pulse to reset said binary counter at the end of each cycle of said sinusoidal signal; an up/down counter having first and second input leads for adding and subtracting to the count in said up/down counter and a plurality of output leads; first and second logic gates each having first, second and third input leads and an output lead, said output of said second zero crossing detector being connected to said first input lead of said first gate, a flip-flop, said flip-flop being connected between a first output lead of said binary counter and a second input lead of each of said first and said second gates, said output lead of said first gate being connected to said first input lead of said up/down counter; an inverter, said inverter being connected between said output of said second zero crossing detector and said first input lead of said second gate, said high frequency source being connected to said third input lead of each of said first and said second gates, said output lead of said second gate being connected to said second input lead of said up/down counter; a comparator having an output lead, said output leads of said binary counter and of said up/down counter being connected to said comparator, said comparator providing a pulse to said output lead each time the count of said binary counter matches the count of said up/down counter, said output lead of said comparator being coupled to said input of said second filtering means, said output of said second filtering means being connected to said second stator winding and to said input lead of said second zero crossing detector; and an output register having a plurality of signal input leads and a trigger input lead, said signal input leads of said register each being connected to a corresponding one of said output leads of said binary counter, said trigger input lead of said register being connected to said output of said third detector, said input of said third detector being connected to said rotor winding of said resolver.

* * * * *

UNITED STATES PATENT OFFICE
CERTIFICATE OF CORRECTION

PATENT NO. : 3,990,062

DATED : November 2, 1976

INVENTOR(S) : George W. Miller and Larry A. Meyer

It is certified that error appears in the above-identified patent and that said Letters Patent are hereby corrected as shown below:

Column 4, line 20, "Q" should be --$\overline{Q}$--

Column 4, line 44, "Q" should be --$\overline{Q}$--

Signed and Sealed this

Seventh Day of June 1977

[SEAL]

Attest:

RUTH C. MASON
*Attesting Officer*

C. MARSHALL DANN
*Commissioner of Patents and Trademarks*